(12) United States Patent
Yang et al.

(10) Patent No.: US 11,200,399 B1
(45) Date of Patent: Dec. 14, 2021

(54) DISPLAY PANEL AND DRIVING METHOD OF DISPLAY PANEL

(71) Applicant: Xiamen Tianma Micro-Electronics Co., Ltd., Xiamen (CN)

(72) Inventors: Xu Yang, Xiamen (CN); Bozhi Liu, Xiamen (CN); Xiai Xu, Xiamen (CN); Guozhao Chen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/132,972

(22) Filed: Dec. 23, 2020

(30) Foreign Application Priority Data

Sep. 28, 2020 (CN) .......................... 202011043315.6

(51) Int. Cl.
| | |
|---|---|
| *G06K 9/00* | (2006.01) |
| *G09G 5/10* | (2006.01) |
| *G09G 3/3233* | (2016.01) |
| *G02F 1/1333* | (2006.01) |
| *H01L 27/32* | (2006.01) |

(52) U.S. Cl.
CPC ......... *G06K 9/0004* (2013.01); *G09G 3/3233* (2013.01); *G09G 5/10* (2013.01); *G02F 1/13338* (2013.01); *G09G 2310/08* (2013.01); *G09G 2320/0626* (2013.01); *G09G 2354/00* (2013.01); *H01L 27/3227* (2013.01)

(58) Field of Classification Search
CPC .... G09G 3/30–3291; G09G 2300/0804–0871; G09G 2354/00; G06K 9/00006–0012
See application file for complete search history.

(56) References Cited

U.S. PATENT DOCUMENTS 9,961,178 B2 * 5/2018 Hong ................... G06F 21/32
10,496,867 B2 * 12/2019 Wang ................. G06K 9/6202
(Continued)

FOREIGN PATENT DOCUMENTS

| CN | 110008883 A | 7/2019 |
| CN | 107122759 B | 1/2020 |

(Continued)

OTHER PUBLICATIONS

Chinese Office Action related to Application No. 202011043315.6; dated Sep. 15, 2021.

*Primary Examiner* — Patrick F Marinelli
(74) *Attorney, Agent, or Firm* — von Briesen & Roper, s.c.

(57) ABSTRACT

Provided are a display panel and a driving method of a display panel. The display panel includes a substrate, a sub-pixel array located on the substrate, and at least one fingerprint identification unit group; each of the at least one fingerprint identification unit group includes a first fingerprint identification unit and a second fingerprint identification unit; the first fingerprint identification unit, which is in the fingerprint identification unit group to which the second fingerprint identification unit belongs, is electrically connected to the pixel circuit of at least one sub-pixel which is peripheral to the second fingerprint identification unit; the first fingerprint identification unit is configured to adjust, in a first fingerprint identification phase, the at least one sub-pixel electrically connected to the first fingerprint identification unit from a first luminance to a second luminance.

22 Claims, 11 Drawing Sheets

(56) References Cited

U.S. PATENT DOCUMENTS

| | | | |
|---|---|---|---|
| 10,672,334 B2* | 6/2020 | Li | G09G 3/3266 |
| 10,720,099 B2* | 7/2020 | Feng | G06F 3/0416 |
| 10,748,476 B2* | 8/2020 | Zhao | G09G 3/3266 |
| 10,789,442 B2* | 9/2020 | Yang | G06K 9/00013 |
| 10,909,916 B2* | 2/2021 | Feng | G09G 3/3233 |
| 10,970,517 B2* | 4/2021 | Wang | G06K 9/00006 |
| 10,990,842 B2* | 4/2021 | Kim | G09G 3/32 |
| 2017/0289805 A1* | 10/2017 | Hong | H04W 12/08 |
| 2019/0012509 A1* | 1/2019 | Li | G09G 3/3208 |
| 2019/0188444 A1* | 6/2019 | Yang | G06K 9/00013 |
| 2019/0347987 A1* | 11/2019 | Zhao | G09G 3/3225 |
| 2020/0005706 A1* | 1/2020 | Li | G06K 9/0004 |
| 2020/0019804 A1* | 1/2020 | Kim | G09G 3/32 |
| 2020/0035151 A1* | 1/2020 | Feng | G09G 3/3233 |
| 2020/0110918 A1* | 4/2020 | Zhang | G06K 9/0004 |
| 2020/0279086 A1* | 9/2020 | Wang | G02F 1/13338 |
| 2020/0279527 A1* | 9/2020 | Feng | G06K 9/0002 |
| 2021/0012080 A1* | 1/2021 | Fan | G06F 3/0416 |
| 2021/0109638 A1* | 4/2021 | Hsieh | G06F 3/0416 |
| 2021/0109639 A1* | 4/2021 | Hsieh | G06F 3/0412 |

FOREIGN PATENT DOCUMENTS

| | | |
|---|---|---|
| CN | 111144268 A | 5/2020 |
| CN | 108376250 B | 6/2020 |
| CN | 111666923 A | 9/2020 |

* cited by examiner

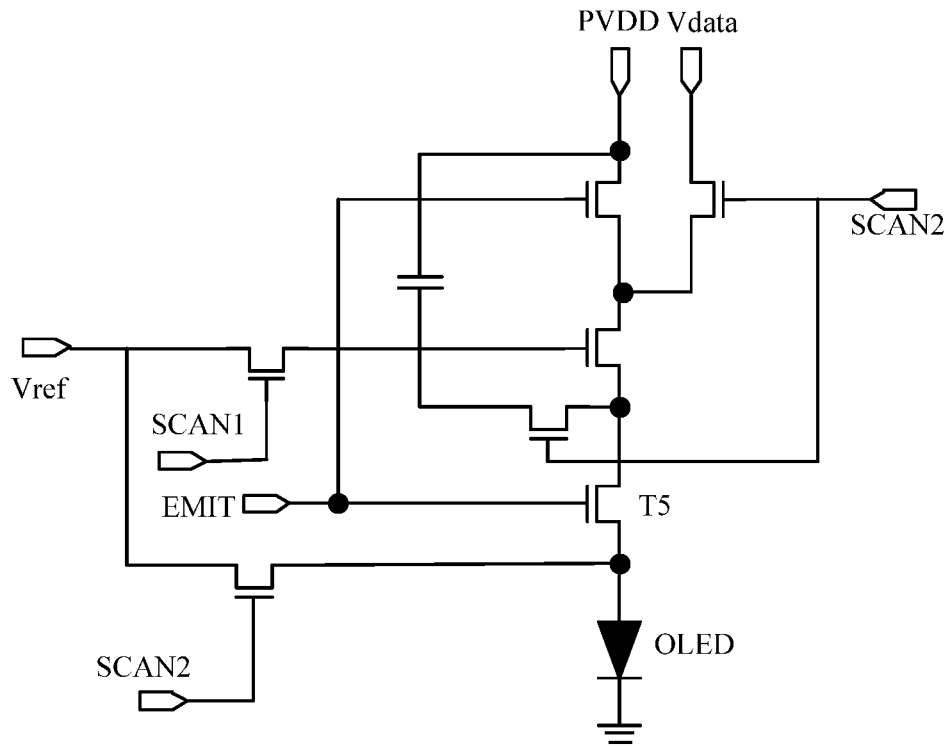

FIG. 11

| In the first fingerprint identification phase, a first fingerprint identification unit in a fingerprint identification unit group adjusts a sub-pixel, electrically connected to the first fingerprint identification unit, from a first luminance to a second luminance | ~ S110 |

| In the second fingerprint identification phase, a fingerprint identification is performed by a second fingerprint identification unit in the fingerprint identification unit group according to the light emitted by the sub-pixel at the second luminance and reflected by a touch subject | ~ S120 |

FIG. 12

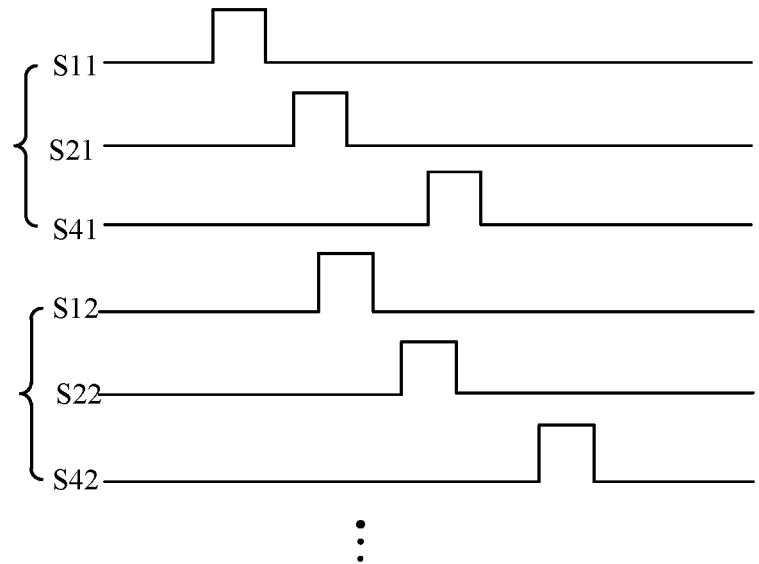

FIG. 15

| In the first fingerprint identification phase, the gating transistor is controlled to be turned on, and the first light sensing element adjusts the sub-pixel, electrically connected to the first light sensing element, from the first luminance to the second luminance | ~ S210 |

| In the second fingerprint identification phase, the gating transistor is controlled to be turned off, the second light sensing element senses light emitted by the sub-pixel at the second luminance and reflected by the touch subject to generate an electrical signal, the first drive transistor generates a fingerprint identification signal according to the electrical signal generated by the second light sensing element, and the selection output transistor is turned on and outputs the fingerprint identification signal | ~ S220 |

FIG. 16

DISPLAY PANEL AND DRIVING METHOD OF DISPLAY PANEL

CROSS-REFERENCE TO RELATED APPLICATIONS

This application claims priority to a Chinese patent application No. 202011043315.6 filed with CNIPA on Sep. 28, 2020, the disclosure of which is incorporated herein by reference in its entirety.

TECHNICAL FIELD

The present disclosure relates to the technical field of display panels and, in particular, to a display panel and a driving method of a display panel.

BACKGROUND

Fingerprints have become an agent for biometric identification due to their characteristics of lifelong immutability, uniqueness and convenience. Especially in display devices, functions such as unlocking a display device and payment can be implemented by performing identification on user fingerprints.

At present, in order to enable the display device to implement the fingerprint identification function, a fingerprint identification element is disposed in the display panel, and when the display panel is in the fingerprint identification phase, the fingerprint identification element receives fingerprint information reflected by the finger and performs the fingerprint identification. However, in the existing fingerprint identification process, due to the small signal difference between light signals which are returned via the finger and received by the fingerprint identification elements from fingerprint valleys and fingerprint ridges, the identification results of fingerprint identification are inaccurate, thereby affecting the precision and efficiency of the fingerprint identification on the display panel.

SUMMARY

The present disclosure provides a display panel and a driving method of a display device, so as to improve the accuracy of the fingerprint identification result.

In an embodiment, the present disclosure provides a display panel. The display panel includes:
a substrate;
a sub-pixel array on the substrate; and
at least one fingerprint identification unit group.

Each of the at least one fingerprint identification unit group includes at least one first fingerprint identification unit and one second fingerprint identification unit, in each of the at least one fingerprint identification unit group, the first fingerprint identification unit, which is in the fingerprint identification unit group to which the second fingerprint identification unit belongs, is electrically connected to a pixel circuit of at least one sub-pixel which is peripheral to the second fingerprint identification unit.

The at least one first fingerprint identification unit is configured to adjust, in a first fingerprint identification phase, the at least one sub-pixel, electrically connected to the first fingerprint identification unit, from a first luminance to a second luminance. The second fingerprint identification unit is configured to perform, in a second fingerprint identification phase, a fingerprint identification according to light emitted by the at least one sub-pixel at the second luminance and reflected by a touch subject.

The second luminance is greater than the first luminance.

In an embodiment, the present disclosure further provides a driving method of a display panel. The driving method includes steps described below.

In a first fingerprint identification phase, a first fingerprint identification unit in a fingerprint identification unit group adjusts a sub-pixel electrically connected to the first fingerprint identification unit from a first luminance to a second luminance.

In a second fingerprint identification phase, a second fingerprint identification unit in the fingerprint identification unit group performs a fingerprint identification according to light emitted by the sub-pixel at the second luminance and reflected by a touch subject.

The second luminance is greater than the first luminance.

BRIEF DESCRIPTION OF DRAWINGS

FIG. 11 is a structural diagram of a drive circuit of an organic light-emitting display panel according to an embodiment of the present disclosure;

FIG. 12 is a flowchart of a fingerprint identification driving method according to an embodiment of the present disclosure;

FIG. 15 is yet another driving timing view of a circuit of a fingerprint identification unit group according to an embodiment of the present disclosure;

FIG. 16 is a flowchart of another fingerprint identification driving method according to an embodiment of the present disclosure;

DETAILED DESCRIPTION

Figure 1:
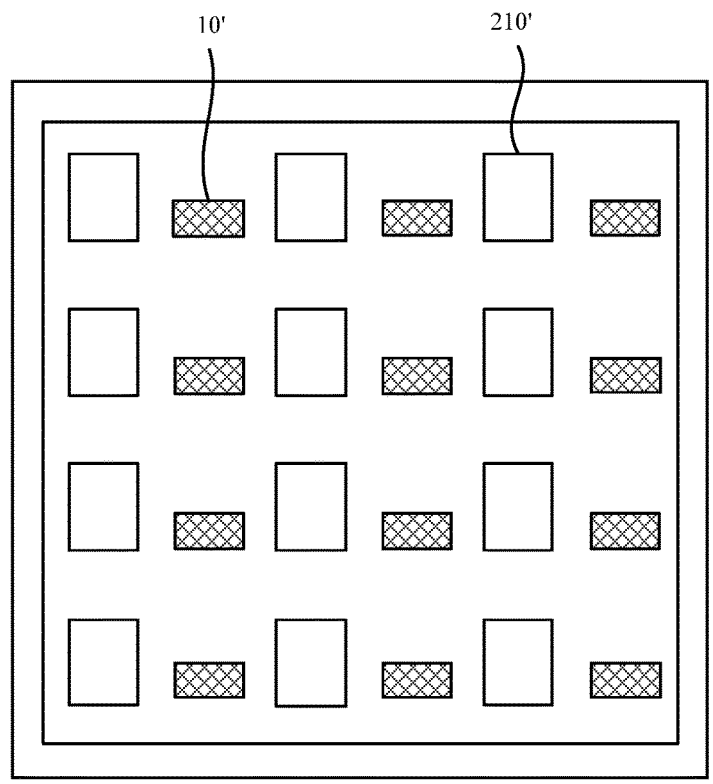
FIG. 1 is a structural view of a display panel in the related art.

Hereinafter the present disclosure will be further described in detail in conjunction with the drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
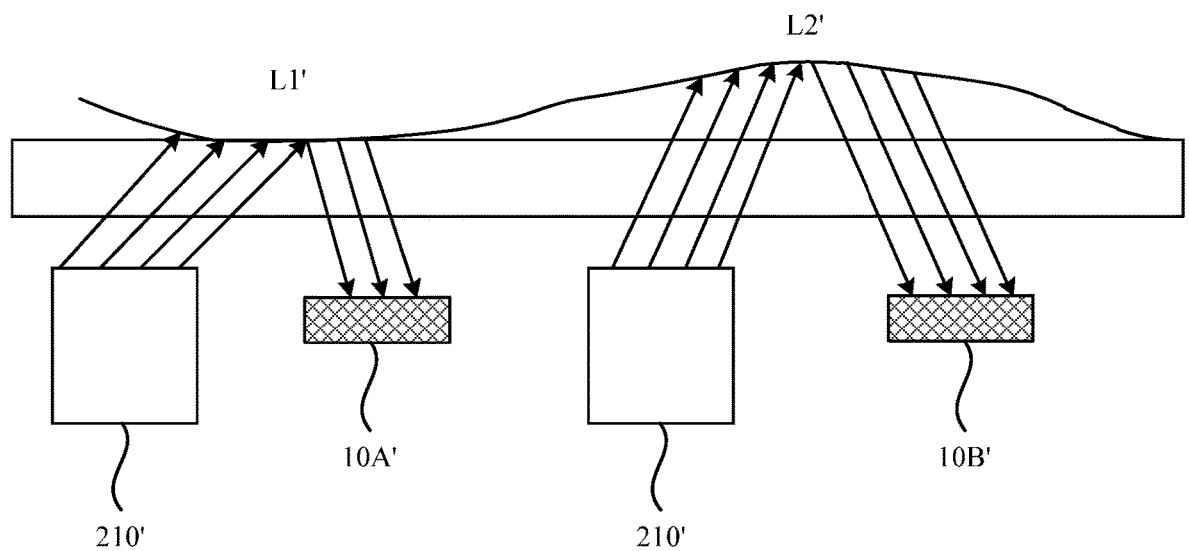
FIG. 2 is a schematic view illustrating a principle of fingerprint identification performed by a fingerprint identification element in the display panel provided in FIG. 1.

FIG. 1 is a structural diagram of a display panel in the related art. As shown in FIG. 1, the display panel includes multiple sub-pixels 210', and a fingerprint identification element 10 is further provided in the display panel. When the display panel is in a fingerprint identification phase, for light emitted by the display panel, there is a difference between the light reflected by a fingerprint ridge and the light reflected by a fingerprint valley. Compared with the fingerprint ridge, since there is an air gap between the fingerprint valley and the display panel, the light emitted from the display panel is irradiated to the gap between the display panel and the fingerprint valley, which is equivalent to the light spreading from a dense medium to a thinner medium, part of the light will be in total emission, therefore, a luminous flux of the reflected light at the fingerprint valley is greater than a luminous flux of the reflected light at the fingerprint ridge. The fingerprint identification element 10' may implement the fingerprint identification according to a difference between received light signals reflected from the fingerprint valley and the fingerprint ridge. FIG. 2 is a schematic view illustrating a principle of fingerprint identification performed by a fingerprint identification element in the display panel provided in FIG. 1. As shown in FIG. 2, when the display panel is in the fingerprint identification phase, the light emitted from the sub-pixel 210' is received by the fingerprint identification element via the reflection of the finger, where a fingerprint identification element 10A' receives light beams reflected from the fingerprint ridge L1', and a fingerprint identification element 10B' receives light beams reflected from the fingerprint valley L2'. According to the received light signal returned from the finger, the fingerprint identification element converts the light signal into an electrical signal to implement the fingerprint identification function. In the existing art, due to the relatively small signal difference between light signals returned via the reflection of the finger which are received by the fingerprint identification elements 10A' and 10B' from the fingerprint valley and the fingerprint ridge, the identification results of the fingerprint identification are inaccurate, thereby affecting the precision and efficiency of fingerprint identification on the display panel.

Figure 3:
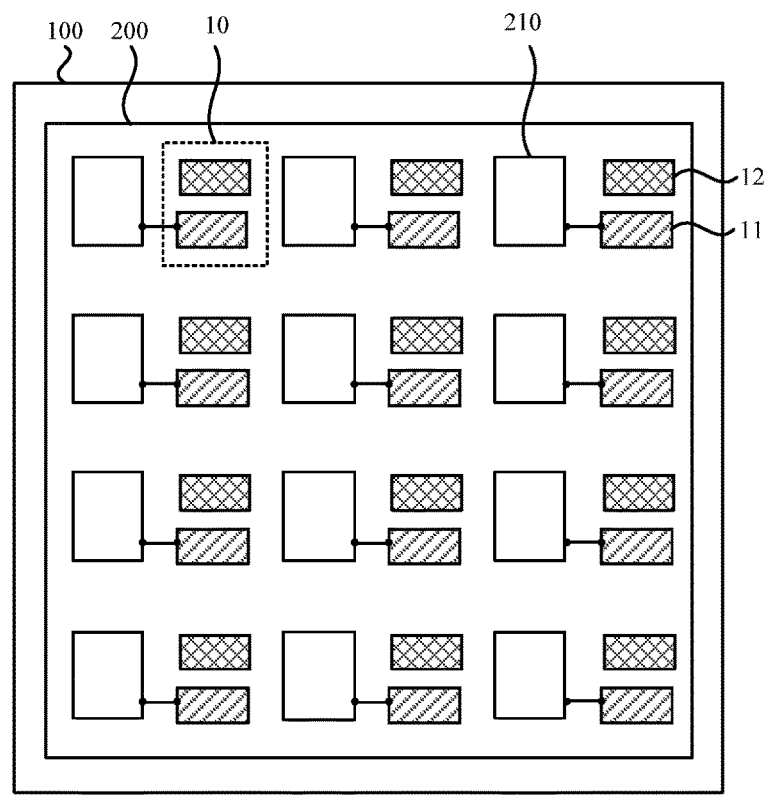
FIG. 3 is a structural diagram of a display panel according to an embodiment of the present disclosure.

The embodiments of the present disclosure provide a display panel. FIG. 3 is a structural diagram of a display panel according to an embodiment of the present disclosure.

Figure 4:
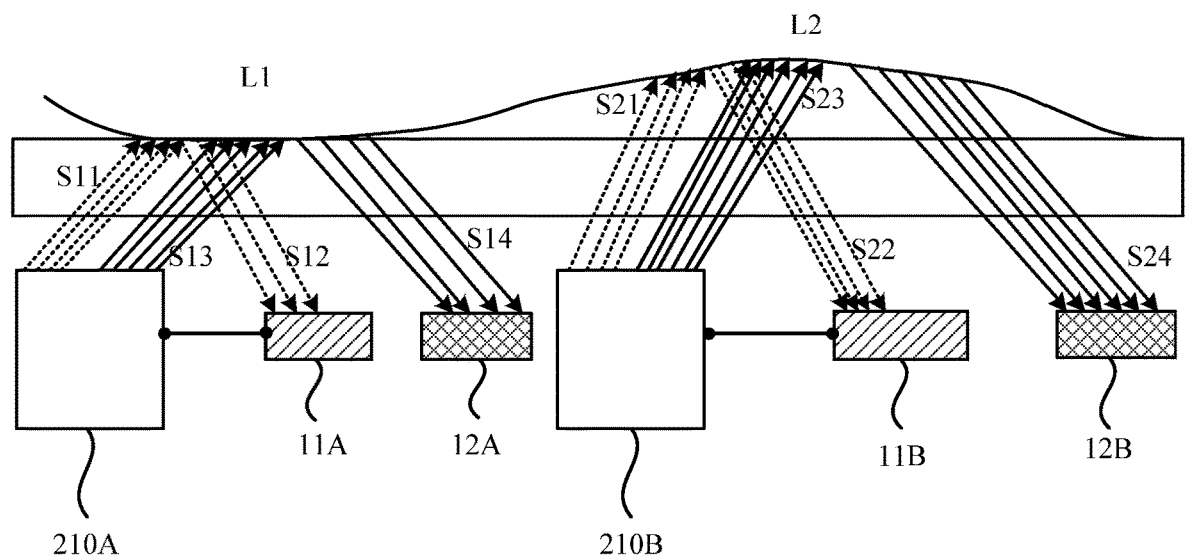
FIG. 4 is a schematic view illustrating a principle of fingerprint identification performed by a fingerprint identification unit group in the display panel provided in FIG. 3.

FIG. 4 is a schematic view illustrating a principle of fingerprint identification performed by a fingerprint identification unit group in the display panel provided in FIG. 3. As shown in FIG. 3 and FIG. 4, the display panel includes a substrate 100, a sub-pixel array 200 located on the substrate 100, and at least one fingerprint identification unit group 10. Each fingerprint identification unit group 10 includes at least one first fingerprint identification unit 11 and one second fingerprint identification unit 12. A pixel circuit of at least one sub-pixel 210 which is peripheral to the second fingerprint identification unit 12 is electrically connected to the first fingerprint identification unit 11 in a fingerprint identification unit group 10 to which the second fingerprint identification unit 12 belongs. The first fingerprint identification unit 11 is configured to adjust, in a first fingerprint identification phase, a sub-pixel 210, electrically connected to the first fingerprint identification unit, from a first luminance to a second luminance. The second fingerprint identification unit is configured to perform, in a second fingerprint identification phase, a fingerprint identification according to light emitted by the at least one sub-pixel at the second luminance and reflected by a touch subject. The second luminance is greater than the first luminance.

In the embodiments of the present disclosure, the fingerprint identification unit group 10 includes one second fingerprint identification unit 12 and at least one first fingerprint identification unit 11. In FIG. 3, exemplarily, one fingerprint identification unit group 10 includes one first fingerprint identification unit 11 and one second fingerprint identification unit 12, and a pixel circuit of a sub-pixel on a left side of the second fingerprint identification unit 12 is electrically connected to the first fingerprint identification unit 11 in the fingerprint identification unit group 10 to which the second fingerprint identification unit 12 belongs. The dashed arrows in FIG. 4 denote the light transmission in the first fingerprint identification phase, and the solid arrows denote the light transmission in the second fingerprint identification phase. As shown in FIG. 4, in a non-fingerprint identification phase, display luminance of a sub-pixel corresponding to the fingerprint ridge L1 and display luminance of a sub-pixel corresponding to the fingerprint valley L2 are considered to be approximately equal.

In the first fingerprint identification phase, light S12, which is formed by the fingerprint ridge L1 reflecting light S11 emitted by a sub-pixel 210A, is illuminated to a first fingerprint identification unit 11A. Light S22, which is formed by the fingerprint valley L2 reflecting light S21 emitted by the sub-pixel 210B, is illuminated to a first fingerprint identification unit 11B. Luminous fluxes of the light S11 and the light S21 are considered to be approximately equal, but because light reflected by the fingerprint valley L2 is more than light reflected by the fingerprint ridge L1, the luminous flux of the light S12 is less than the luminous flux of the light S22.

The first fingerprint identification unit 11A generates an electrical signal according to the received light S12, and adjusts the sub-pixel 210A, electrically connected to the first fingerprint identification unit, from a first luminance IA1 to a second luminance IA2, where the second luminance IA2 is greater than the first luminance IA1. The first fingerprint identification unit 11B generates an electrical signal according to the received light S22 and adjusts the sub-pixel 210B electrically connected thereto from a first luminance IB1 to a second luminance IB2, where the second luminance IB2 is greater than the first luminance IB1.

Since the light S12 received by the first fingerprint identification unit 11A is less than the light S22 received by the first fingerprint identification unit 11B, the electrical signal generated by the first fingerprint identification unit 11B is greater than the electrical signal generated by the first fingerprint identification unit 11A, and the change conducted by the first fingerprint identification unit 11B on the luminance of the sub-pixel 210B electrically connected to the first fingerprint identification unit 11B is greater than the change conducted by the first fingerprint identification unit 11A on the luminance of the sub-pixel 210A electrically connected to the first fingerprint identification unit 11A, that is, the difference between IB2 and IB1 is greater than the difference between IA2 and IA1. Moreover, since sub-pixels in the area corresponding to the fingerprint ridge and the fingerprint valley adjacent to each other are relatively close, the first luminance IA1 and the first luminance IB1 are considered to be approximately equal, IB2 is greater than IA2. Therefore, in the second fingerprint identification phase, the luminous flux of light S13 illuminated by sub-pixels at the fingerprint ridge L1 is less than the luminous flux of light S23 illuminated at the fingerprint valley L2, and in the second fingerprint identification phase, the difference between light S14 reflected by the fingerprint ridge L1 and light S24 reflected by the fingerprint valley L2 is further amplified. Therefore, in the second fingerprint identification phase, the difference of light signals received by a second fingerprint identification unit 12A and a second fingerprint identification unit 12B is significantly increased compared to that of the existing fingerprint identification panel (e.g., the difference of light signals received by the fingerprint identification elements 10A' and 10B' at the fingerprint valley and the fingerprint ridge in FIG. 2), thereby improving the accuracy of fingerprint identification.

In the display panel provided by the embodiments of the present disclosure, the fingerprint identification unit group is configured to include one second fingerprint identification unit and at least one first fingerprint identification unit; where the first fingerprint identification unit is electrically connected to a pixel circuit of at least one sub-pixel in the fingerprint identification unit group to which the second fingerprint identification unit belongs; the first fingerprint identification unit adjusts the at least one sub-pixel electrically connected to the first fingerprint identification unit from a first luminance to a second luminance, and the second fingerprint identification unit performs, in the second fingerprint identification phase, the fingerprint identification according to light which is emitted by the sub-pixel at the second luminance and reflected by the touch subject. As the first fingerprint identification unit increases the display luminance of the sub-pixel electrically connected to the first fingerprint identification unit and the display luminance of the corresponding sub-pixel at the fingerprint valley is greater than the display luminance of the corresponding sub-pixel at the fingerprint ridge, the difference between the light signals which are respectively reflected from the fingerprint valley and the fingerprint ridge and then received by the second fingerprint identification unit can be increased, thereby improving the accuracy of the fingerprint identification result.

A vertical projection, on the substrate, of the fingerprint identification unit group 10 is located within a vertical projection, on the substrate 100, of a gap formed among sub-pixels 210.

As shown in FIG. 3, by setting the fingerprint identification unit group 10 to be located at the gap formed among sub-pixels 210, the impact of the fingerprint identification unit group 10 on the aperture ratio of the display panel is avoided, and the display effect of the display panel is improved.

It is to be noted that in FIG. 3, exemplarily, both the first fingerprint identification unit 11 and the second fingerprint identification unit 12 within one fingerprint identification unit group 10 are disposed at a gap formed between two adjacent sub-pixels 210, and in other embodiments, the first fingerprint identification unit 11 in the fingerprint identification unit group 10 may be located at a gap formed between two adjacent sub-pixels 210 while the second fingerprint identification unit 12 belonging to the same fingerprint identification unit group as the first fingerprint identification unit 11 is located at a gap formed between another two adjacent sub-pixels 210. The relative locations of the first fingerprint identification unit 11 and the second fingerprint identification unit 12 which are in a same fingerprint identification unit group 10 are not limited in this embodiment, as long as the fingerprint identification unit group 10 is located at the gap formed among sub-pixels and the aperture ratio of the display panel is not affected. The arrangement of the first fingerprint identification unit 11 and the second fingerprint identification unit 12 will be introduced through several embodiments.

Figure 5:
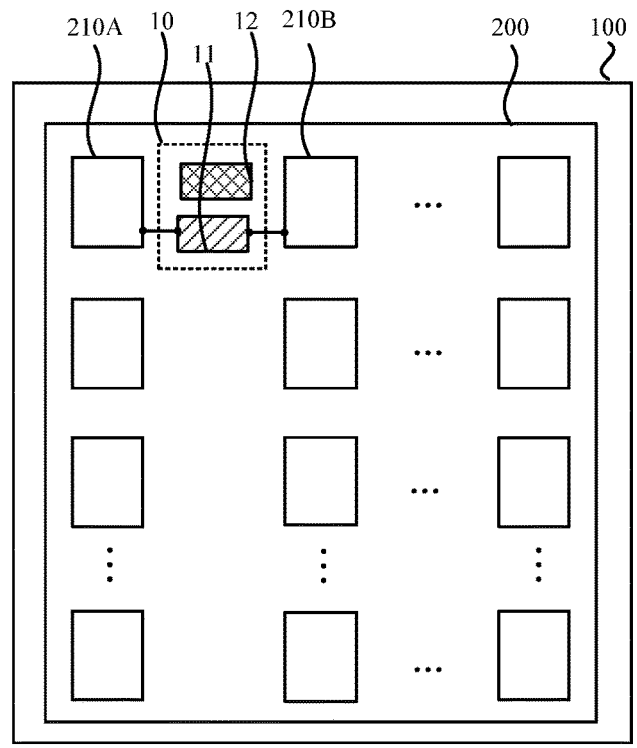
FIG. 5 is a structural diagram of another display panel according to an embodiment of the present disclosure.

On the basis of the above embodiments, pixel circuits of sub-pixels within a first threshold range from the second fingerprint identification unit are electrically connected to the first fingerprint identification unit of the fingerprint identification unit group to which the second fingerprint identification unit belongs. FIG. 5 is a structural diagram of another display panel according to an embodiment of the present disclosure. As shown in FIG. 5, both sub-pixel 210A and sub-pixel 210B in FIG. 5 are electrically connected to the first fingerprint identification unit 11 of the fingerprint identification unit group 10 to which the second fingerprint identification unit 12 belongs. Distances of the sub-pixel 210A and the sub-pixel 210B from the second fingerprint identification unit 12 are all less than or equal to the first threshold range. By setting the pixel circuits of the sub-pixels within the first threshold range from the second fingerprint identification unit 12 to be electrically connected to the first fingerprint identification unit 11 of the fingerprint identification unit group 10 to which the second fingerprint identification unit 12 belongs, a case where light emitted from a sub-pixel whose luminance is not adjusted by the first fingerprint identification unit 11 is reflected onto the second fingerprint identification unit 12 is avoided. If the light emitted from the sub-pixel whose luminance is not adjusted by the first fingerprint identification unit 11 is reflected onto the second fingerprint identification unit 12, the fingerprint identification noise can be easily generated, thereby affecting the results of fingerprint identification.

In an embodiment, the first threshold range is less than or equal to 70 um.

The first threshold range is set to be less than or equal to 70 um, that is, pixel circuits of sub-pixels within a distance of 70 um from the second fingerprint identification unit are electrically connected to the first fingerprint identification unit of the fingerprint identification unit group to which the second fingerprint identification unit belongs, thereby avoiding the light emitted from the sub-pixel whose luminance is not adjusted by the first fingerprint identification unit 11 to be reflected onto the second fingerprint identification unit 12.

In an embodiment, the second fingerprint identification unit is located between adjacent sub-pixels, and pixel circuits of the sub-pixels adjacent to the second fingerprint identification unit are electrically connected to the first fingerprint identification unit in a same fingerprint identification unit group.

For example, with reference to FIG. 5, by setting that the second fingerprint identification unit 12 is located between adjacent sub-pixels 210A and 210B and that the pixel circuits of both sub-pixels 210A and 210B adjacent to the second fingerprint identification unit 12 are electrically connected to the first fingerprint identification unit 11 in the fingerprint identification unit group 10 to which the second fingerprint identification unit 12 belongs, the first fingerprint identification unit 11 may be used for compensating the display luminance of adjacent two sub-pixels 210A and 210B, thereby ensuring the uniformity of light reflected onto the second fingerprint identification unit 12 via the finger after emitted from adjacent sub-pixels, and improving the accuracy of the fingerprint identification result.

In an embodiment, each of the at least one fingerprint identification unit group may be located between adjacent sub-pixels.

As shown in FIG. 5, by setting the fingerprint identification unit group to be located between adjacent sub-pixels, that is, components of a same fingerprint identification unit group are compactly disposed, a too-long trace layout in the fingerprint identification unit group can be avoided, and the preparation process can be simplified.

Figure 6:
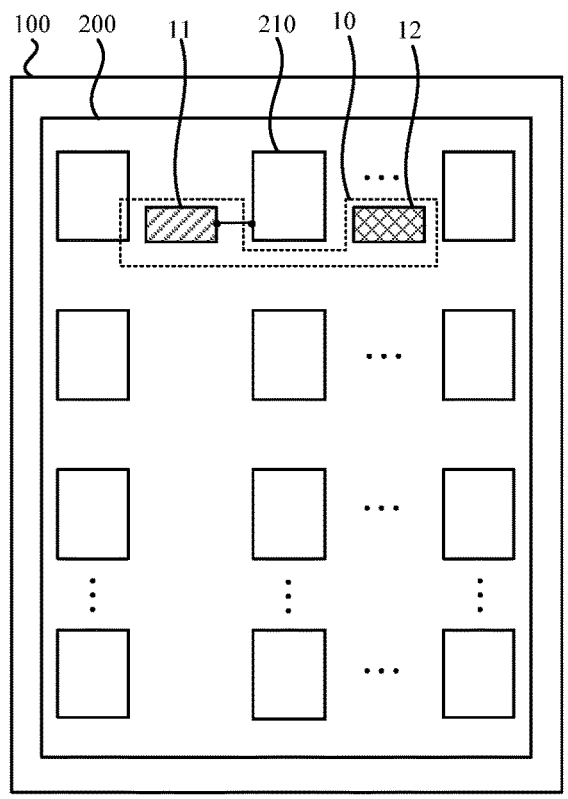
FIG. 6 is a structural diagram of yet another display panel according to an embodiment of the present disclosure.

On the basis of the above embodiments, FIG. 6 is a structural diagram of yet another display panel according to an embodiment of the present disclosure. As shown in FIG. 6, the first fingerprint identification unit 11 and the second fingerprint identification unit 12, which are adjacent to each other and in the same fingerprint identification unit group 10, are spaced with one sub-pixel 210.

As shown in FIG. 6, by setting the first fingerprint identification unit 11 and the second fingerprint identification unit 12, which are adjacent to each other and in the same fingerprint identification unit group 10, to be spaced with one sub-pixel 210, the accuracy of the fingerprint identification result of the display panel can be ensured, and meanwhile, and the aperture ratio of the display panel being affected due to the over-crowding setting of the first fingerprint identification unit and the second fingerprint identification unit is avoided.

Figure 7:
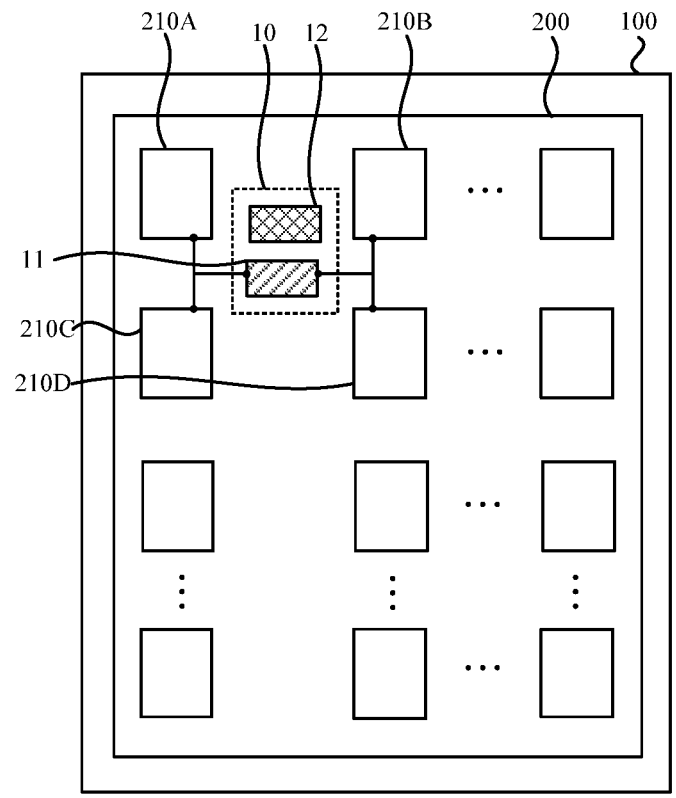
FIG. 7 is a structural diagram of yet another display panel according to an embodiment of the present disclosure.

On the basis of the above embodiments, FIG. 7 is a structural diagram of yet another display panel according to an embodiment of the present disclosure. As shown in FIG. 7, the second fingerprint identification unit 12 is located at a diagonal gap of 2*2 arranged sub-pixels, and all pixel circuits of the four sub-pixels adjacent to the second fingerprint identification unit 12 are electrically connected to the first fingerprint identification unit in the same fingerprint identification unit group.

As shown in FIG. 7, the second fingerprint identification unit 12 is located at a diagonal gap of the 2*2 arranged sub-pixels, and the four sub-pixels 210A, 210B, 210C, and 210D adjacent to the second fingerprint identification unit 12 are electrically connected to the first fingerprint identification unit 11 in the fingerprint identification unit group 10. A setting number of first fingerprint identification units can be reduced by setting the 2*2 sub-pixel arrangement using one fingerprint identification unit group.

It is to be noted that the above embodiments exemplify set the location relationship between the first fingerprint identification unit and the second fingerprint identification unit in the fingerprint identification unit group, but in other embodiments, the first fingerprint identification unit and the second fingerprint identification unit in one fingerprint identification unit group may also be set in other manners, which is not limited in the embodiments of the present disclosure.

In an embodiment, a distance between adjacent fingerprint identification unit groups is less than or equal to 150 um.

If the distance between fingerprint identification unit groups is too large, i.e., if the fingerprint identification unit groups of the display panel are set too sparse, the precision of the fingerprint identification is reduced. When the distance between adjacent fingerprint identification unit groups is estimated to be less than or equal to 150 um according to the distance between the fingerprint ridge and the fingerprint valley and the current size of the pixel unit in the display panel, relatively precise fingerprint identification results can be implemented.

Figure 8:
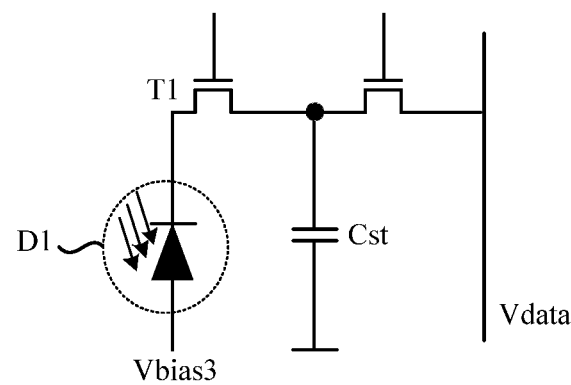
FIG. 8 is a circuit diagram of a first fingerprint identification unit according to an embodiment of the present disclosure.

On the basis of the above embodiments, FIG. 8 is a circuit diagram of a first fingerprint identification unit according to an embodiment of the present disclosure. As shown in FIG. 8, the first fingerprint identification unit includes a first light sensing element D1 and a gating transistor T1, and the gating transistor T1 is connected in series between the pixel circuit of the sub-pixel and the first light sensing element D1.

As shown in FIG. 8, when the display panel is in the first fingerprint identification phase, the first light sensing element D1 of the first fingerprint identification unit collects a light signal returned by the finger and converts this light signal into an electrical signal, and the converted electrical signal is inputted to the pixel circuit of the sub-pixel through the gating transistor T1. In this case, the display luminance of the sub-pixel electrically connected to the first fingerprint identification unit is additionally increased since the sub-pixel electrically connected to the first fingerprint identification unit receives the electrical signal converted by the first fingerprint identification unit, then light emitted by the sub-pixel with adjusted luminance is reflected by the finger to form reflected light, and the reflected light is then reflected onto the second fingerprint identification unit, so that the signal difference between signals received by the second fingerprint identification unit respectively at the fingerprint valley and at the fingerprint ridge is increased, thereby effectively improving the accuracy and precision of the fingerprint identification structure of the second fingerprint identification unit.

In an embodiment, the at least one fingerprint identification unit group comprises multiple fingerprint identification unit groups which are arranged in an array, and gates of gating transistors of fingerprint identification unit groups in a same row are connected to the same first scanning line.

The gates of gating transistors of the fingerprint identification unit groups in the same row may be connected to the same first scanning line. When the display panel is in the first fingerprint identification phase, the gating transistors are scanned and turned on row by row to implement sensing of the first fingerprint identification unit.

First scanning lines electrically connected to gating transistors of all rows of the fingerprint identification unit groups are electrically connected.

Furthermore, the first scanning lines electrically connected to the gating transistors of all rows of the fingerprint identification unit groups are electrically connected. In this case, there is no need for a clock control signal to perform scanning row by row, and the gating transistors in the entire display panel are directly controlled to be turned on through a drive integrated circuit (IC), thereby implementing the sensing function of the first fingerprint identification units of the entire display panel.

Figure 9:
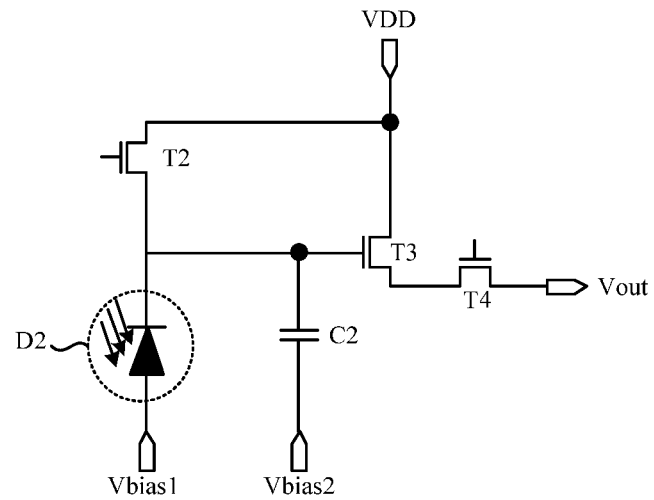
FIG. 9 is a circuit diagram of a second fingerprint identification unit according to an embodiment of the present disclosure.

On the basis of the above embodiments, FIG. 9 is a circuit diagram of a second fingerprint identification unit according to an embodiment of the present disclosure. As shown in FIG. 9, the second fingerprint identification unit includes a second light sensing element D2, a first drive transistor T3, a selection output transistor T4, and a storage capacitor C2. The second light sensing element D2 is configured to sense, in the second fingerprint identification phase, the light emitted by the sub-pixel at the second luminance and reflected by the touch subject to generate an electrical signal. The first drive transistor T3 is configured to generate, in the second fingerprint identification phase, a fingerprint identification signal according to the electrical signal generated by the second light sensing element D2. The storage capacitor C2 is configured to maintain a gate potential of the first drive transistor T3 in the second fingerprint identification phase. The selection output transistor T4 is configured to be turned on in the second fingerprint identification phase and output the fingerprint identification signal.

In an embodiment, the second fingerprint identification unit further includes a reset transistor T2, which is connected in series between a power signal input line VDD and a gate of the first drive transistor T3. The second fingerprint identification phase includes a reset sub-phase. The reset transistor is configured to reset the gate of the first drive transistor T3 in the reset sub-phase.

As shown in FIG. 9, when the display panel is in the second fingerprint identification phase, first in the reset sub-phase, a gate of the reset transistor T2 receives a scanning signal to be turned on, and then resets the gate of the first drive transistor T3 to avoid the impact of the previous fingerprint identification signal on the accuracy of results of the next fingerprint identification. In a data reading sub-phase, the first drive transistor T3 generates a fingerprint identification signal according to the electrical signal generated by the second light sensing element D2, and the fingerprint identification signal is outputted through the selection output transistor T4, thereby implementing the fingerprint identification.

With continued reference to FIG. 9, the gate of the first drive transistor T3 is electrically connected to a second electrode of the second light sensing element D2 and a first electrode of the storage capacitor C2 respectively, a first electrode of the second light sensing element D2 is electrically connected to a first bias signal end Vbias1, and a second electrode of the storage capacitor is electrically connected to a second bias signal end Vbias2. A first electrode of the first drive transistor T3 is electrically connected to a power signal input line VDD, a second electrode of the first drive transistor T3 is electrically connected to a first electrode of the selection output transistor T4, and a second electrode of the selection output transistor T4 is electrically connected to a fingerprint identification signal output line Vout.

As shown in FIG. 9, when the display panel is in the second fingerprint identification phase, the second light sensing element D2 of the second fingerprint identification unit collects a light signal returned by the finger and converts the light signal into an electrical signal, the converted electrical signal is outputted to the fingerprint identification signal output line Vout through the first drive transistor T3 and the selection output transistor T4, and the fingerprint identification signal output line outputs a fingerprint identification signal to a fingerprint identification drive chip.

In an embodiment, the first bias signal end Vbias1 is electrically connected to the second bias signal end Vbias2.

The first bias signal end Vbias1 may be set to be electrically connected to the second bias signal end Vbias2, so that the signal traces of the display panel are reduced, thereby facilitating the reduction of the display panel cost.

In an embodiment, the first bias signal end Vbias1 and/or the second bias signal end Vbias2 is electrically connected to a common electrode of sub-pixels.

Since the bias signal inputted by the first bias signal end Vbias1 and/or the second bias signal end Vbias2 may be a fixed low-level signal, the applied bias signal may be set to be the same as a common voltage applied on the common electrode of the pixels in the display panel, which can enable a pin for the display drive chip providing the common voltage signal to be the same pin for providing the bias signal, thereby reducing the number of pins of the drive chip in the display panel and further facilitating the reduction of the display panel cost.

In an embodiment, a first electrode of the first light sensing element D1 is electrically connected to a third bias signal end Vbias3, a second electrode of the first light sensing element D1 is electrically connected to a second electrode of the gating transistor T1, a first electrode of the gating transistor T1 is electrically connected to the pixel circuit of the sub-pixel, and the third bias signal end Vbias3 is electrically connected to the first bias signal end Vbias1.

Furthermore, since a bias signal inputted by the third bias signal end may be a fixed low-level signal, the third bias signal end may be electrically connected to the first bias signal end, thereby further reducing the signal traces of the display panel.

In an embodiment, the at least one fingerprint identification unit group includes multiple fingerprint identification unit groups which are arranged in an array, and gates of reset transistors of the fingerprint identification unit groups in a same row are connected to a same second scanning line.

The gates of reset transistors of the fingerprint identification unit groups in the same row may be connected to the same second scanning line. When the display panel is in the second fingerprint identification phase, reset transistors are scanned and turned on row by row to implement the reset of second fingerprint identification units.

In an embodiment, second scanning lines electrically connected to reset transistors of all rows of the fingerprint identification unit groups are electrically connected.

Furthermore, the second scanning lines electrically connected to the reset transistors of all rows of the fingerprint identification unit groups are electrically connected. In this case, there is no need for a clock control signal to perform scanning row by row, and the reset transistors in the entire display panel are directly controlled to be turned on through the drive IC, thereby implementing the reset function of the second fingerprint identification units in the entire display panel.

In an embodiment, the display panel further includes multiple third scanning lines, and pixel circuits of sub-pixels in a same row are electrically connected to a same one of the multiple third scanning lines. The display panel further includes a first scanning drive circuit, and the first scanning drive circuit includes multiple cascaded first shift register units. The multiple cascaded first shift register units are electrically connected to the multiple third scanning lines in one-to-one correspondence, and at least a partial number of the first shift register units are electrically connected to multiple first scanning lines in one-to-one correspondence.

The partial number of the multiple cascaded first shift register units are set to be electrically connected to the multiple first scanning lines in a one-to-one correspondence, that is, the third scanning lines share a part of the multiple cascaded first shift register units with a part of the multiple first scanning lines, and a first scanning signal inputted by a first scanning signal input end and a third scanning signal inputted by a third scanning signal input end are controlled to change according to a certain time sequence, so as to control each transistor to be turned on in different phases, thereby reducing the number of first shift register units set in a non-display area.

In an embodiment, the display panel further includes multiple third scanning lines, and pixel circuits of sub-pixels in a same row are electrically connected to a same third scanning line. The display panel further includes a first scanning drive circuit, and the first scanning drive circuit includes multiple cascaded first shift register units. The multiple cascaded first shift register units are electrically connected to the multiple third scanning lines in a one-to-one correspondence, and at least a partial number of the multiple cascaded first shift register units are electrically connected to multiple second scanning lines in one-to-one correspondence.

The partial number of the multiple cascaded first shift register units are set to be electrically connected to the multiple second scanning lines in one-to-one correspondence, that is, the third scanning lines share a part of the multiple cascaded first shift register units with a part of second scanning lines, and a second scanning signal inputted by a second scanning signal input end and a third scanning signal inputted by the third scanning signal input end are controlled to change according to a certain time sequence, so as to control each transistor to be turned on in different phases.

In an embodiment, the display panel further includes multiple third scanning lines, and pixel circuits of sub-pixels in a same row are electrically connected to a same third scanning line. The display panel further includes a first scanning drive circuit, and the first scanning drive circuit includes multiple cascaded first shift register units. The multiple cascaded first shift register units are electrically connected to the multiple third scanning lines in a one-to-one correspondence. The at least one fingerprint identification unit group includes multiple fingerprint identification unit groups which are arranged in an array, and gates of selection output transistors of fingerprint identification unit groups in a same row are connected to a same fourth scanning line. At least a partial number of the multiple cascaded first shift register units are electrically connected to multiple fourth scanning lines in one-to-one correspondence.

The partial number of the multiple cascaded first shift register units are set to be electrically connected to the multiple fourth scanning lines in a one-to-one correspondence, that is, the third scanning lines share the part of the first shift register units with a part of the multiple fourth scanning lines, and a fourth scanning signal inputted by a fourth scanning signal input end and the third scanning signal inputted by the third scanning signal input end are controlled to change according to a certain time sequence, so as to control each transistor to be turned on in different phases.

Figure 10:
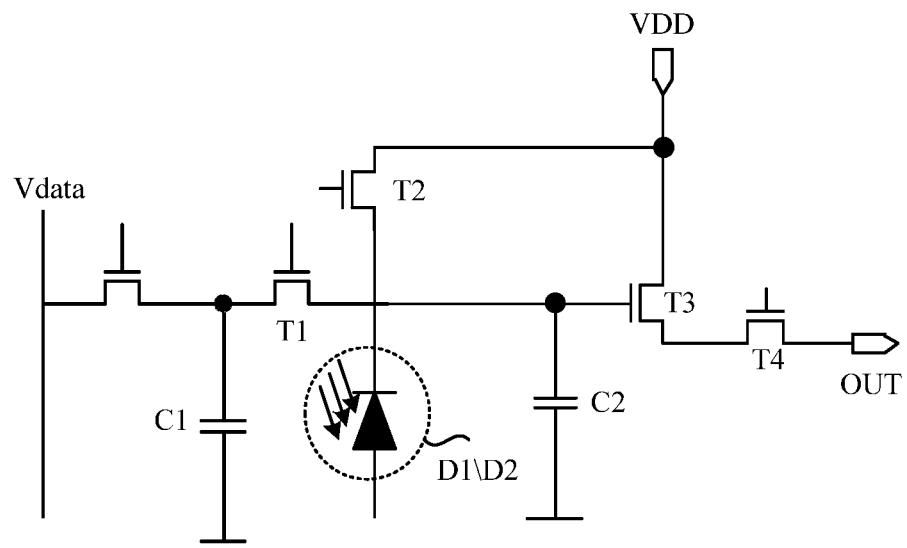
FIG. 10 is a circuit diagram of a fingerprint identification unit group according to an embodiment of the present disclosure.

On the basis of the above embodiments, FIG. 10 is a circuit diagram of a fingerprint identification unit group according to an embodiment of the present disclosure. As shown in FIG. 10, in a same fingerprint identification unit group, the first light sensing element of the first fingerprint identification unit is multiplexed as the second light sensing element of the second fingerprint identification unit.

As shown in FIG. 10, by sharing the light sensing element by both the first fingerprint identification unit and the second fingerprint identification unit, in the first fingerprint identification phase, the light sensing element is used for collecting a light signal returned by the finger and converting the light signal into an electrical signal, and the converted electrical signal is inputted to the pixel circuit of the sub-pixel through the gating transistor T1. In the second fingerprint identification phase, the light sensing element is used for collecting the light signal returned by the finger and converting the light signal into an electrical signal, and the converted electrical signal is outputted as a fingerprint identification signal through the first drive transistor T3 and the selection output transistor T4 to perform the fingerprint identification.

In an embodiment, the display panel is a liquid crystal display panel, and the pixel circuit of each of the at least one sub-pixel includes a switching transistor. A first electrode of the switching transistor is electrically connected to a data line, and a second electrode of the switching transistor is electrically connected to a pixel electrode of the at least one sub-pixel. The second electrode of the switching transistor of the at least one sub-pixel which is peripheral to the second fingerprint identification unit is electrically connected to the first fingerprint identification unit in the fingerprint identification unit group to which the second fingerprint identification unit belongs.

When the display panel is the liquid crystal display panel, the pixel circuit of the sub-pixel includes a switching transistor. As the second electrode of the switching transistor is electrically connected to the first fingerprint identification unit, the first light sensing element D1 of the first fingerprint identification unit collects the light signal returned by the finger and converts the light signal into an electrical signal, and the converted electrical signal is transmitted to the pixel electrode of the sub-pixel after passing through the gating transistor T1. Since the common electrode of the sub-pixels is a fixed potential, when the pixel electrode receives the electrical signal converted by the first light sensing element, the voltage difference between the pixel electrode and the common electrode of the sub-pixel electrically connected to the first fingerprint identification unit increases, so the display luminance of the sub-pixel accordingly increases.

In an embodiment, the display panel is an organic light-emitting display panel, and the pixel circuit of each of the at least one sub-pixel includes a second drive transistor. A gate of the second drive transistor of at least one sub-pixel which is peripheral to the second fingerprint identification unit is electrically connected to the first fingerprint identification unit in the fingerprint identification unit group to which the second fingerprint identification unit belongs.

FIG. 11 exemplarily illustrates a structural diagram of a drive circuit of an organic light-emitting display panel. As shown in FIG. 11, when the display panel is an organic light-emitting display panel, the pixel circuit of each of the at least one sub-pixel includes a second drive transistor T5. As a gate of the second drive transistor T5 is electrically connected to the first fingerprint identification unit, the first light sensing element D1 of the first fingerprint identification unit collects the light signal returned by the finger and converts the light signal into an electrical signal, and the converted electrical signal is transmitted to the gate of the second drive transistor T5 after passing through the gating transistor T1. In this way, the gate voltage of the second drive transistor T5 is affected, thereby changing the drive current of a light-emitting element in the sub-pixel electrically connected to the first fingerprint identification unit and increasing the display luminance of the sub-pixel.

On the basis of the above embodiments, FIG. 12 is a flowchart of a fingerprint identification driving method according to an embodiment of the present disclosure. As shown in FIG. 12, the driving method includes steps described below.

S110, in the first fingerprint identification phase, a first fingerprint identification unit in a fingerprint identification unit group adjusts a sub-pixel electrically connected to the first fingerprint identification unit from a first luminance to a second luminance.

S120, in the second fingerprint identification phase, a second fingerprint identification unit in the fingerprint identification unit group performs a fingerprint identification according to light emitted by the at least one sub-pixel at the second luminance and reflected by a touch subject.

The second luminance is greater than the first luminance.

In the driving method provided by the embodiments of the present disclosure, in the first fingerprint identification phase, the first fingerprint identification unit in the fingerprint identification unit group adjusts the at least one sub-pixel, electrically connected to the first fingerprint identification unit, from the first luminance to the second luminance, and in the second fingerprint identification phase, the second fingerprint identification unit in the fingerprint identification unit group performs the fingerprint identification according to the light emitted by the at least one sub-pixel at the second luminance and reflected by the touch subject. As the first fingerprint identification unit increases the display luminance of the at least one sub-pixel electrically connected to the first fingerprint identification unit, the difference between fingerprint information received by the second fingerprint identification unit respectively from the fingerprint valley and the fingerprint ridge is increased, thereby improving the accuracy of the fingerprint identification result.

In an embodiment, the method further includes a step described below, after each negative frame display period, the first fingerprint identification phase and the second fingerprint identification phase are sequentially performed.

For a liquid crystal display panel, in order to prevent data signals having the same polarity being applied to the pixel electrode all the time, which causes liquid crystal molecules to be susceptible to polarization and leads to the residual image phenomena, during the time of driving the display, positive and negative data voltages are alternatively applied to the pixel electrode with the common voltage on the common electrode as a reference, that is, positive and negative frames alternatively drive the display. In the embodiments of the present disclosure, the first fingerprint identification phase and the second fingerprint identification phase are performed in sequence on the display panel after each negative frame display period, which can ensure that the first fingerprint identification unit in the fingerprint identification unit group increases the voltage difference between the pixel electrode and the common electrode of the sub-pixel electrically connected to the first fingerprint identification unit and that the increased display luminance of the sub-pixel at the fingerprint valley is greater than the increased display luminance of the sub-pixel at the fingerprint ridge. Since the light, emitted by the sub-pixel after the luminance of the sub-pixel has been adjusted, reflected by the finger onto the second fingerprint identification unit is increased, the difference between the light received at the fingerprint valley and the fingerprint ridge is increased, thereby improving the accuracy of the fingerprint identification result.

In an embodiment, the first fingerprint identification unit includes a first light sensing element and a gating transistor. The gating transistor is connected in series between the pixel circuit of the at least one sub-pixel and the first light sensing element. Fingerprint identification unit groups exist and are arranged in an array. Gates of gating transistors of fingerprint identification unit groups in a same row are connected to a same first scanning line. In the first fingerprint identification phase, an effective pulse is provided to first scanning lines row by row so that the first fingerprint identification unit in each of the fingerprint identification unit groups in each row adjusts the sub-pixel, electrically connected to the first fingerprint identification unit, from the first luminance to the second luminance.

In an embodiment, the first fingerprint identification unit includes a first light sensing element and a gating transistor. The gating transistor is connected in series between the pixel circuit of the at least one sub-pixel and the first light sensing element. The fingerprint identification unit groups exist and are arranged in an array. Gates of gating transistors of fingerprint identification unit groups in a same row are connected to a same first scanning line. First scanning lines corresponding to gating transistors of all rows of the fingerprint identification unit groups are electrically connected. In the first fingerprint identification phase, an effective pulse is simultaneously provided to all rows of the first scanning lines so that the first fingerprint identification unit in each of the fingerprint identification unit groups in each row adjusts the sub-pixel, electrically connected to the first fingerprint identification unit, from the first luminance to the second luminance.

Figure 13:
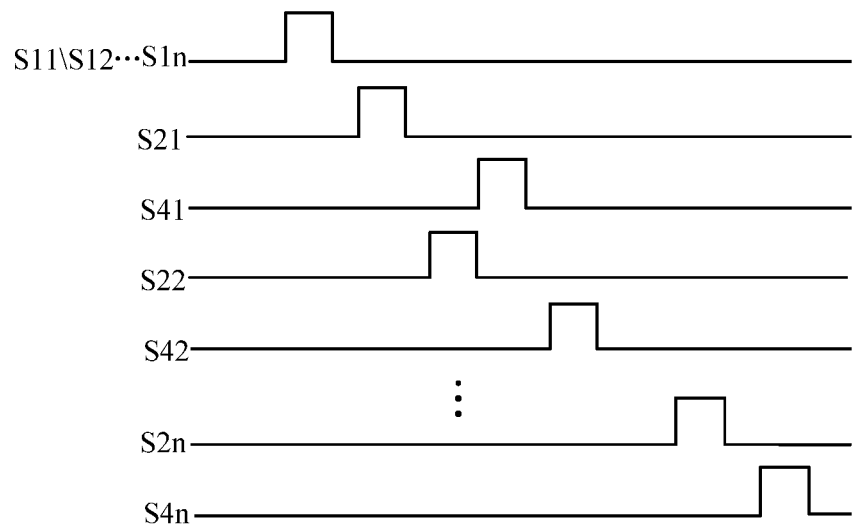
FIG. 13 is a driving timing view of a circuit of a fingerprint identification unit group according to an embodiment of the present disclosure.
Figure 14:
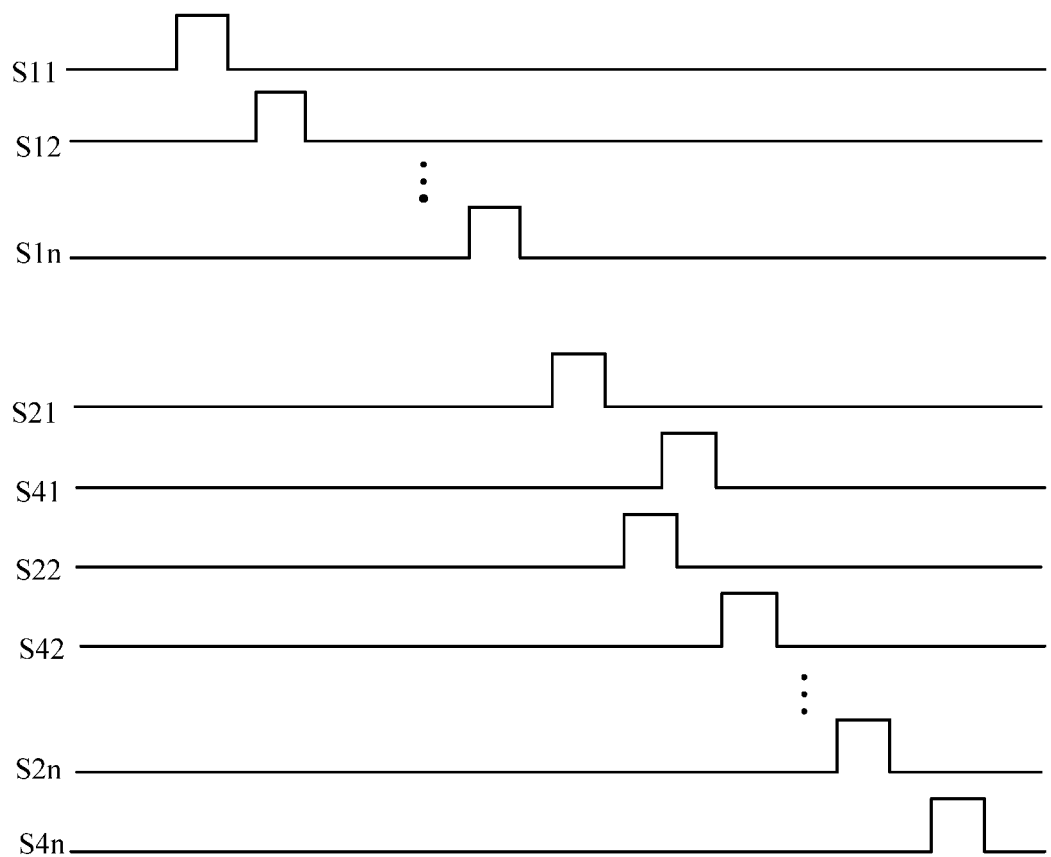
FIG. 14 is another driving timing view of a circuit of a fingerprint identification unit group according to an embodiment of the present disclosure.
Figure 17:
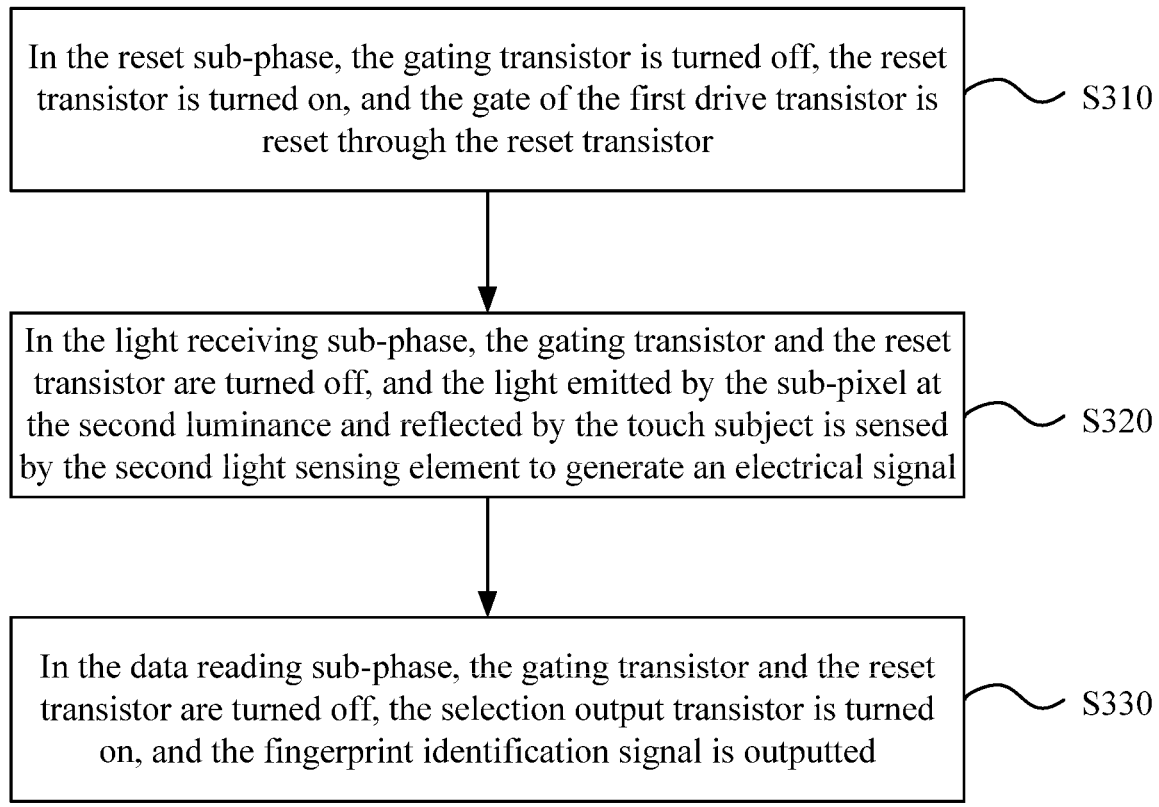
FIG. 17 is a flowchart of yet another fingerprint identification driving method according to an embodiment of the present disclosure.

Exemplarily, FIG. 13 illustrates that an effective pulse is simultaneously provided to all rows of the first scanning lines, and FIG. 14 illustrates that an effective pulse is provided row by row to each row of the first scanning lines. In FIG. 13 and FIG. 14, S1$n$ denotes a first scanning signal provided by each row of the first scanning lines, n is a row serial number, S11 denotes the first scanning signal provided by the first scanning line of the first row, S12 denotes the first scanning signal provided by the first scanning line of the second row, and S13 denotes the first scanning signal provided by the first scanning line of the third row. S2$n$ denotes a second scanning signal provided by each row of the second scanning lines, n is the row serial number, S21 denotes the second scanning signal provided by the second scanning line of the first row, S22 denotes the second scanning signal provided by the second scanning line of the second row, and S23 denotes the second scanning signal provided by the second scanning line of the third row. S4$n$ denotes a fourth scanning signal provided by each row of the fourth scanning lines, S41 denotes the fourth scanning signal provided by the fourth scanning line of the first row, S42 denotes the fourth scanning signal provided by the fourth scanning line of the second row, and S43 denotes the fourth scanning signal provided by the fourth scanning line of the third row.

When all rows of the first scanning lines are provided with the effective pulse simultaneously, as shown in FIG. 13, all rows of the first scanning lines of the display panel are provided with the effective pulse simultaneously. In this case, after gates of gating transistors in the first fingerprint identification units of the display panel respectively receive the first scanning signal transmitted by a corresponding first scanning line, the gating transistors are all turned on, and first light sensing elements of first fingerprint identification units collect light signals returned by the finger respectively, convert the light signals into electrical signals, and output the electrical signals to the pixel circuit of the sub-pixel electrically connected to a respective one of the first fingerprint identification units. The respective one of the first fingerprint identification units then adjusts the luminance of the sub-pixel electrically connected thereto from the first luminance to the second luminance.

When the first scanning line in the same row is provided with the effective pulse row by row, as shown in FIG. 14, the effective pulse is first provided to the first scanning line of the first row. In this case, after the gates of the gating transistors in the first row of the display panel receive the first scanning signal S11 transmitted by the first scanning line, the gating transistors in the first row are turned on, and first light sensing elements of first fingerprint identification units respectively collect light signals returned by the finger, convert the light signals into electrical signals, and output the electrical signals to the pixel circuit of the sub-pixel electrically connected to the respective one of the first fingerprint identification units. The first fingerprint identification units in the first row then adjust the luminance of the sub-pixels electrically connected thereto from the first luminance to the second luminance. After that, the effective pulse is provided to the first scanning line of the second row, ensuring that gating transistors in the second row are turned on after gates of the gating transistors in the second row receive the first scanning signal S12 transmitted by the first scanning line of the second row, and luminance of sub-pixels in the second row are adjusted from the first luminance to the second luminance. In so doing, the effective pulse is provided to each remaining row of the first scanning lines row by row in the same way to complete the adjustment of the luminance of sub-pixels in each row from the first luminance to the second luminance.

It is to be noted that in FIG. 14, exemplarily, it is only after the first scanning lines complete the scanning operation of the first fingerprint identification phase row by row that the display panel enters the second fingerprint identification phase to perform scanning. Alternatively, it may also be set that after the first scanning lines complete the scanning of the first fingerprint identification phase on the first row, the display panel performs the scanning of the first fingerprint identification phase on the second row, at the same time the scanning operation of the second fingerprint identification phase may also be performed on the first row to implement the fingerprint identification. For example, as shown in FIG. 15, the effective pulse is provided to the first scanning line of the first row first. In this case, after gates of gating transistors in the first row of the display panel receive the first scanning signal S11 transmitted by the first scanning line of the first row, the gating transistors in the first row are turned on, and the first light sensing elements of the first fingerprint identification units collect light signals returned by the finger respectively, convert the light signals into electrical signals, and outputs the electrical signals to the pixel circuit of the sub-pixel electrically connected to a respective one of the first fingerprint identification units. The first fingerprint identification units in the first row then adjust the luminance of the sub-pixels electrically connected thereto from the first luminance to the second luminance. After that, the effective pulse is provided to the first scanning line of the second row. During the time of providing the effective pulse to the first scanning line of the second row, the effective pulse may also be provided to the second scanning line of the first row. In this case, after gates of reset transistors in the first row of the display panel receive the second scanning signal S21 transmitted by the second scanning line of the first row, the reset transistors in the first row are turned on and receive the reset signal to complete the reset of gates of first drive transistors and first electrodes of storage capacitors. After reset transistors of fingerprint identification unit groups in each row reset gates of first drive transistors, the effective pulse is provided to the fourth scanning line of the first row to implement the fingerprint identification on the first row.

In an embodiment, the first fingerprint identification unit includes a first light sensing element and a gating transistor, the gating transistor is connected in series between the pixel circuit of the at least one sub-pixel and the first light sensing element, and the second fingerprint identification unit includes a second light sensing element, a first drive transistor, a selection output transistor, and a storage capacitor. The method includes steps described below.

In step S210, in the first fingerprint identification phase, the gating transistor is controlled to be turned on, and the first light sensing element adjusts the sub-pixel, electrically connected to the first light sensing element, from the first luminance to the second luminance.

In step S220, in the second fingerprint identification phase, the gating transistor is controlled to be turned off, and the second light sensing element senses the light emitted by the sub-pixel at the second luminance and reflected by the touch subject to generate an electrical signal, the first drive transistor generates a fingerprint identification signal according to the electrical signal generated by the second light sensing element, and the selection output transistor is turned on and outputs the fingerprint identification signal.

Figure 18:
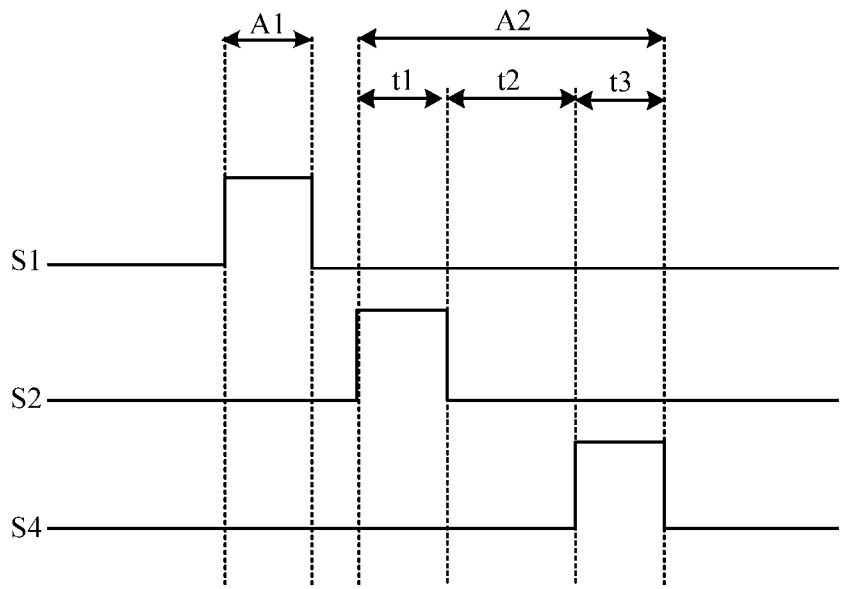
FIG. 18 is yet another driving timing view of a circuit of a fingerprint identification unit group according to an embodiment of the present disclosure.

Exemplarily, FIG. 18 is yet another driving timing view of a circuit of a fingerprint identification unit group according to an embodiment of the present disclosure. As shown in FIG. 18, the fingerprint identification process includes a first fingerprint identification phase A1 and a second fingerprint identification phase A2, S1 denotes a first scanning signal transmitted by the first scanning line, S2 denotes a second scanning signal transmitted by the second scanning line, and S4 denotes a fourth scanning signal transmitted by the fourth scanning line. In the first fingerprint identification phase A1, the effective pulse is provided to the first scanning line, after the gate of the gating transistor in the first fingerprint identification unit receives the first scanning signal transmitted by the first scanning line, the gating transistor is turned on, and the first light sensing element of the first fingerprint identification unit collects a light signal returned by the finger, converts the light signal into the electrical signal, and outputs the electrical signal to the pixel circuit of the sub-pixel, and then the first light sensing element adjusts the luminance of the sub-pixel electrically connected thereto from the first luminance to the second luminance. In the second fingerprint identification phase A2, the first scanning line has no effective pulse, the gating transistor is turned off. Through providing the effective pulse to the fourth scanning line, in this case, the selection output transistor electrically connected to the fourth scanning line is turned on, and the fingerprint identification signal generated by the first drive transistor according to the electrical signal generated by the second light sensing element is outputted, thereby implementing the fingerprint identification.

In an embodiment, the second fingerprint identification unit further includes a reset transistor which is connected in series between a power signal input line and a gate of the first drive transistor, and the second fingerprint identification phase includes a reset sub-phase, a light receiving sub-phase, and a data reading sub-phase. The method includes steps described below.

In step S310, in the reset sub-phase, the gating transistor is turned off, the reset transistor is turned on, and the gate of the first drive transistor is reset through the reset transistor.

In step S320, in the light receiving sub-phase, the gating transistor and the reset transistor are turned off, and the light emitted by the sub-pixel at the second luminance and reflected by the touch subject is sensed by the second light sensing element to generate an electrical signal.

In step S330, in the data reading sub-phase, the gating transistor and the reset transistor are turned off, the selection output transistor is turned on, and the fingerprint identification signal is outputted.

With continued reference to FIG. 18, the second fingerprint identification phase A2 includes a reset sub-phase t1, a light receiving sub-phase t2, and a data reading sub-phase t3 in FIG. 18. In the reset sub-phase t1, the effective pulse is provided to the second scanning line, the reset transistor is turned on after the gate of the reset transistor receives the second scanning signal transmitted by the second scanning line, the second fingerprint identification unit receives the reset signal, and the power signal input end receives a power signal. In this case, the reset signal is transmitted to the gate of the first drive transistor and the first electrode of the storage capacitor, so as to initialize the gate of the first drive transistor and the first electrode of the storage capacitor. In the light receiving sub-phase t2, the second scanning line has no effective pulse, the gating transistor and the reset transistor are turned off, and the second light sensing element senses the light emitted by the sub-pixel at the second luminance and reflected by the touch subject to generate the electrical signal. In the data reading sub-phase t3, the effective pulse is provided to the fourth scanning line. In this case, the selection output transistor is turned on after the gate of the selection output transistor receives the fourth scanning signal transmitted by the fourth scanning line, and the fingerprint identification signal is transmitted to the signal output end through the turned-on selection output transistor and then transmitted to the fingerprint identification drive chip to perform the fingerprint identification.

In an embodiment, a time period of an effective pulse inputted by a control end of the reset transistor is within a time period of an effective pulse inputted by a control end of the selection output transistor. In the reset sub-phase, the selection output transistor is turned on and outputs the fingerprint identification signal.

By setting the time period of the effective pulse inputted by the control end of the reset transistor to be within the time period of the effective pulse inputted by the control end of the selection output transistor, when the display panel is in the reset sub-phase, the reset signal is transmitted to the gate of the first drive transistor T3 and the first electrode of the storage capacitor C2, so as to initialize the gate of the first drive transistor T3 and the first electrode of the storage capacitor C2, but since the selection output transistor T4 is already turned on in the reset sub-phase, the selection output transistor T4 outputs a noise signal in the fingerprint identification signal of the fingerprint identification drive circuit; when the display panel is in the data reading sub-phase, the display panel may determine a final fingerprint signal according to the noise signal in the fingerprint identification signal obtained in the reset sub-phase and the fingerprint signal obtained in the data reading sub-phase, thereby improving the accuracy of the fingerprint identification result of the display panel.

Figure 19:
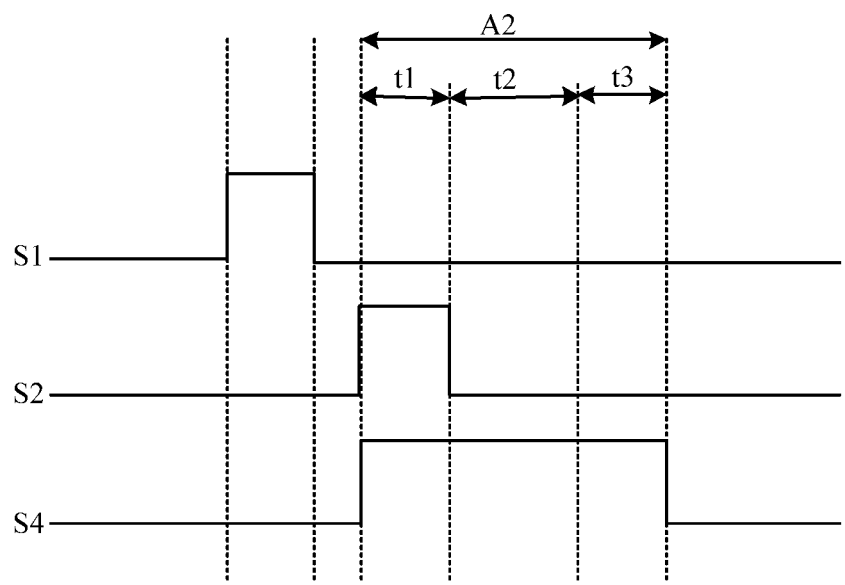
FIG. 19 is yet another driving timing view of a circuit of a fingerprint identification unit group according to an embodiment of the present disclosure.

Exemplarily, FIG. 19 is yet another driving timing view of a circuit of a fingerprint identification unit group according to an embodiment of the present disclosure. As shown in FIG. 19, in the reset sub-phase t1, the effective pulse is provided to the fourth scanning line at the same time when the effective pulse is provided to the second scanning line. Since the effective pulse is provided to the second scanning line, the reset transistor is turned on after the gate of the reset transistor receives the second scanning signal transmitted by the second scanning line, the second fingerprint identification unit receives the reset signal, the power signal input end receives the power signal, and the reset signal is transmitted to the gate of the first drive transistor and the first electrode of the storage capacitor to initialize the gate of the first drive transistor and the first electrode of the storage capacitor. Since the effective pulse is provided to the fourth scanning line in the reset sub-phase t1, the selection output transistor electrically connected to the fourth scanning line is also turned on in the reset sub-phase, and in this case, the selection output transistor outputs a noise signal of the fingerprint identification drive circuit. When the display panel is in the data reading sub-phase t3, the display panel may determine a noiseless fingerprint signal according to the noise signal obtained in the reset sub-phase and the fingerprint signal obtained in the data reading stage, thereby further improving the accuracy of the fingerprint identification result of the display panel.

In an embodiment, the first light sensing element is multiplexed as the second light sensing element.

Since the first fingerprint identification unit and the second fingerprint identification unit share the light sensing element, in the first fingerprint identification phase, the light sensing element is used to collect a light signal returned by the finger and convert the light signals into an electrical signal, and the converted electrical signal is outputted to the pixel circuit of the sub-pixel through the gating transistor. In the second fingerprint identification phase, the light sensing element is used to collect a light signal returned by the finger and convert the light signal into an electrical signal, and the converted electrical signal is outputted as the fingerprint identification signal through the first drive transistor and the selection output transistor to perform the fingerprint identification.

In an embodiment, the fingerprint identification unit groups exist and are arranged in an array, and gates of reset transistors of fingerprint identification unit groups in a same row are connected to a same second scanning line. In the second fingerprint identification phase, the effective pulse is provided to second scanning lines row by row to control reset transistors of fingerprint identification unit groups in each row to reset gates of first drive transistors row by row.

In an embodiment, the fingerprint identification unit groups exist and are arranged in an array, gates of reset transistors of the fingerprint identification unit groups in a same row are connected to a same second scanning line, and second scanning lines electrically connected to reset transistors of the fingerprint identification unit groups in each row are electrically connected. In the second fingerprint identification phase, the effective pulse is simultaneously provided to all rows of the second scanning lines to simultaneously control reset transistors of fingerprint identification unit groups in each row to reset gates of first drive transistors.

Figure 20:
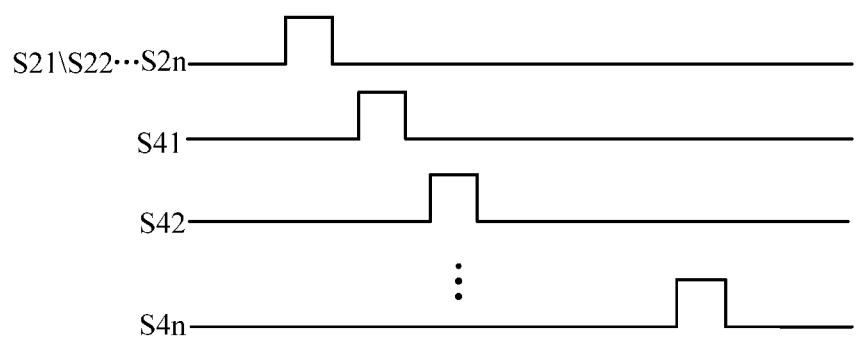
FIG. 20 is yet another driving timing view of a circuit of a fingerprint identification unit group according to an embodiment of the present disclosure.
Figure 21:
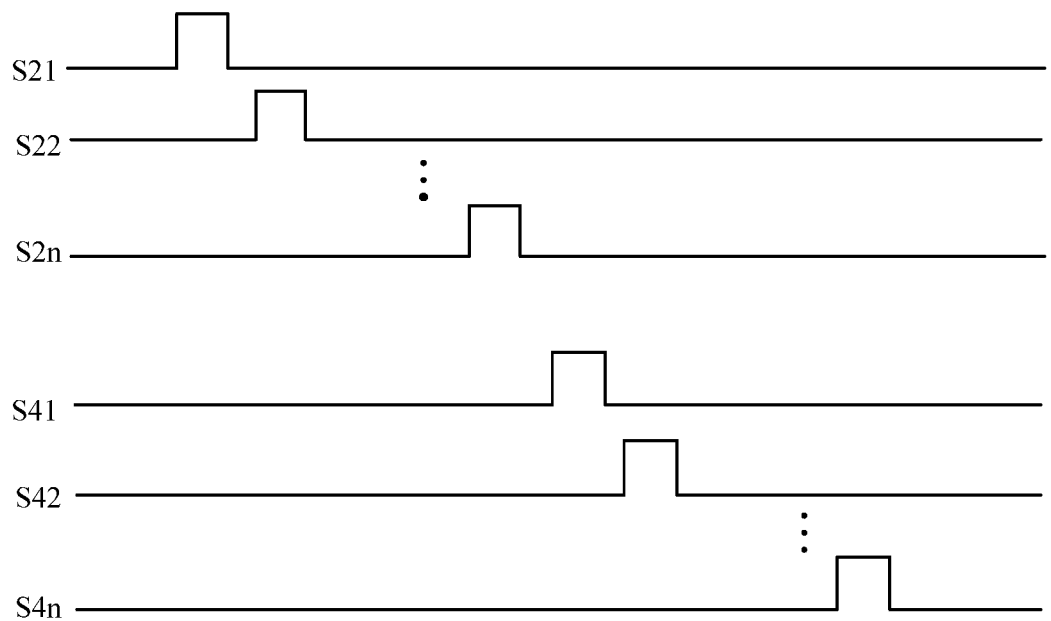
FIG. 21 is yet another driving timing view of a circuit of a fingerprint identification unit group according to an embodiment of the present disclosure.

Exemplarily, FIG. 20 illustrates that the effective pulse is simultaneously provided to all rows of second scanning lines, and FIG. 21 illustrates that the effective pulse is provided row by row to each row of the second scanning lines. In FIG. 20 and FIG. 21, S2n denotes a second scanning signal provided by each row of the second scanning lines, n is the row serial number, S21 denotes the second scanning signal provided by the second scanning line of the first row, S22 denotes the second scanning signal provided by the second scanning line of the second row, and S23 denotes the second scanning signal provided by the second scanning line of the third row. S4n denotes the fourth scanning signals provided by each row of the fourth scanning lines, S41 denotes the fourth scanning signal provided by the fourth scanning line of the first row, S42 denotes the fourth scanning signal provided by the fourth scanning line of the second row, and S43 denotes the fourth scanning signal provided by the fourth scanning line of the third row.

When all rows of the second scanning lines are provided with the effective pulse simultaneously, as shown in FIG. 20, all rows of the second scanning lines of the display panel are provided with the effective pulse simultaneously. In this case, gates of reset transistors in second fingerprint identification units of the display panel receives the second scanning signal S21 transmitted by a respective one of the second scanning lines, the reset transistors are then all turned on, and the reset transistors in the second fingerprint identification units receive the reset signal to reset gates of first drive transistors and first electrodes of storage capacitors. After the reset transistors of the fingerprint identification unit groups in each row are simultaneously controlled to reset the gates of the first drive transistors, the effective pulse is provided to the fourth scanning lines row by row to implement the fingerprint identification. For example, the effective pulse is first provided to the fourth scanning line of the first row. In this case, selection output transistors in the first row are turned on after gates of the selection output transistors receive the fourth scanning signals transmitted by the fourth scanning lines, and the fingerprint identification signals generated by the first drive transistors are transmitted to the signal output end through the selection output transistors to implement the fingerprint identification. The effective pulse is provided to each remaining row of the fourth scanning lines row by row in the same way, to turn on selection output transistors in each row.

When the second scanning lines are provided with the effective pulse row by row, as shown in FIG. 21, the effective pulse is provided to the second scanning line of the first row first. In this case, the gates of the reset transistors in the first row of the display panel receive the second scanning signal S21 transmitted by the second scanning line of the first row, the reset transistors are all turned on, and the reset transistors in the first row receive the reset signal to reset the gates of the first drive transistors and the first electrodes of the storage capacitors. The effective pulse is provided to each remaining row of the second scanning lines row by row in the same way. After reset transistors of fingerprint identification unit groups in each row are controlled to reset gates of first drive transistors row by row, the effective pulse is provided to the fourth scanning lines row by row to implement the fingerprint identification. For example, the effective pulse is provided to the fourth scanning line of the first row first. In this case, selection output transistors in the first row are turned on after gates of the selection output transistors receive the fourth scanning signal transmitted by the fourth scanning line, and the fingerprint identification signals generated by the first drive transistors are transmitted to the signal output end through the selection output transistors to perform the fingerprint identification. The effective pulse is provided to each remaining row of the fourth scanning lines row by row in the same way, to turn on the selection output transistors in each row.

In an embodiment, a first electrode of the first light sensing element is electrically connected to a third bias signal end, a second electrode of the first light sensing element is electrically connected to a second electrode of the gating transistor, a first electrode of the gating transistor is electrically connected to the pixel circuit of the at least one sub-pixel, and a third bias signal provided by the third bias signal end is less than the minimum value of a data signal.

Since the third bias signal provided by the third bias signal end is less than the minimum value of the data signal, which can ensure that the light sensing element collects the light signal returned by the finger and converts the light signals into an electrical signal, and the converted electrical signal is outputted to the pixel circuit of the sub-pixel through the gating transistor, thereby changing the potential of the sub-pixel electrically connected to the pixel circuit, and improving the display luminance of the sub-pixel.

It is to be noted that the circuit driving timing views in the above embodiments exemplarily illustrate the driving timing in a case where all of the gating transistors, the first drive transistors and the selection output transistors are N-type transistors which generally may be turned on under the control of a high-level signal and turned off under the control of a low-level signal. In some alternative embodiments, all of the gating transistors, the first drive transistors and the selection output transistors may be P-type transistors which generally may be turned on under the control of a low-level signal and turned off under the control of a high-level signal. In this case, the corresponding driving timing in the embodiments of the present disclosure would also change accordingly, which will not be repeated herein.

It is to be noted that the above are merely alternative embodiments of the present disclosure and the technical principles used therein. It is to be understood by those skilled in the art that the present disclosure is not limited to the particular embodiments described herein. Those skilled in the art can make various apparent modifications, adaptations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. A display panel, comprising:
   a substrate;
   a sub-pixel array located on the substrate; and
   at least one fingerprint identification unit group, wherein each of the at least one fingerprint identification unit group comprises a first fingerprint identification unit and a second fingerprint identification unit;
   wherein, in each of the at least one fingerprint identification unit group,
      the first fingerprint identification unit, which is in the fingerprint identification unit group to which the second fingerprint identification unit belongs, is electrically connected to a pixel circuit of at least one sub-pixel which is peripheral to the second fingerprint identification unit; and
      the first fingerprint identification unit is configured to adjust, in a first fingerprint identification phase, the at least one sub-pixel electrically connected to the first fingerprint identification unit from a first luminance to a second luminance; and the second fingerprint identification unit is configured to perform, in a second fingerprint identification phase, a fingerprint identification according to light emitted by the at least one sub-pixel at the second luminance and reflected by a touch subject; wherein the second luminance is greater than the first luminance.

2. The display panel of claim 1, wherein a vertical projection, on the substrate, of the at least one fingerprint identification unit group is located within a vertical projection, on the substrate, of a gap formed among sub-pixels.

3. The display panel of claim 1, wherein the pixel circuit of each of the at least one sub-pixel within a first threshold range from the second fingerprint identification unit is electrically connected to the first fingerprint identification unit of the fingerprint identification unit group to which the second fingerprint identification unit belongs.

4. The display panel of claim 3, wherein the first threshold range is less than or equal to 70 um.

5. The display panel of claim 2, wherein the second fingerprint identification unit is located between adjacent sub-pixels; and pixel circuits of the sub-pixels adjacent to the second fingerprint identification unit are electrically connected to the first fingerprint identification unit in a same fingerprint identification unit group.

6. The display panel of claim 1, wherein each of the at least one fingerprint identification unit group is located between adjacent sub-pixels.

7. The display panel of claim 1, wherein the first fingerprint identification unit and the second fingerprint identification unit, which are adjacent to each other and in a same fingerprint identification unit group, are spaced with one sub-pixel.

8. The display panel of claim 2, wherein the second fingerprint identification unit is located at a diagonal gap of 2*2 arranged sub-pixels; and
all pixel circuits of the four sub-pixels adjacent to the second fingerprint identification unit are electrically connected to the first fingerprint identification unit in a same fingerprint identification unit group.

9. The display panel of claim 1, wherein the first fingerprint identification unit comprises a first light sensing element and a gating transistor; and the gating transistor is connected in series between the pixel circuit of the at least one sub-pixel and the first light sensing element.

10. The display panel of claim 9, wherein the second fingerprint identification unit comprises a second light sensing element, a first drive transistor, a selection output transistor, and a storage capacitor; and wherein
the second light sensing element is configured to sense, in the second fingerprint identification phase, the light emitted by the at least one sub-pixel at the second luminance and reflected by the touch subject to generate an electrical signal;
the first drive transistor is configured to generate, in the second fingerprint identification phase, a fingerprint identification signal according to the electrical signal generated by the second light sensing element;
the storage capacitor is configured to maintain a gate potential of the first drive transistor in the second fingerprint identification phase; and
the selection output transistor is configured to be turned on in the second fingerprint identification phase and output the fingerprint identification signal.

11. The display panel of claim 10, wherein a gate of the first drive transistor is electrically connected to a second electrode of the second light sensing element and a first electrode of the storage capacitor respectively; a first electrode of the second light sensing element is electrically connected to a first bias signal end; a second electrode of the storage capacitor is electrically connected to a second bias signal end; and
a first electrode of the first drive transistor is electrically connected to a power signal input line, a second electrode of the first drive transistor is electrically connected to a first electrode of the selection output transistor, and a second electrode of the selection output transistor is electrically connected to a fingerprint identification signal output line.

12. The display panel of claim 10, wherein the second fingerprint identification unit further comprises a reset transistor connected in series between a power signal input line and a gate of the first drive transistor; the second fingerprint identification phase comprises a reset sub-phase;
and the reset transistor is configured to reset the gate of the first drive transistor in the reset sub-phase.

13. The display panel of claim 10, wherein in a same fingerprint identification unit group, the first light sensing element of the first fingerprint identification unit is multiplexed as the second light sensing element of the second fingerprint identification unit.

14. The display panel of claim 1, wherein the display panel is a liquid crystal display panel, and the pixel circuit of each of the at least one sub-pixel comprises a switching transistor; a first electrode of the switching transistor is electrically connected to a data line; a second electrode of the switching transistor is electrically connected to a pixel electrode of the at least one sub-pixel; and
the second electrode of the switching transistor of the at least one sub-pixel which is peripheral to the second fingerprint identification unit is electrically connected to the first fingerprint identification unit in the fingerprint identification unit group to which the second fingerprint identification unit belongs.

15. The display panel of claim 1, wherein the display panel is an organic light-emitting display panel; the pixel circuit of each of the at least one sub-pixel comprises a second drive transistor; and
a gate of the second drive transistor of the at least one sub-pixel which is peripheral to the second fingerprint identification unit is electrically connected to the first fingerprint identification unit in the fingerprint identification unit group to which the second fingerprint identification unit belongs.

16. A driving method of a display panel, comprising:
in a first fingerprint identification phase, adjusting, by a first fingerprint identification unit in a fingerprint identification unit group, a sub-pixel electrically connected to the first fingerprint identification unit from a first luminance to a second luminance; and
in a second fingerprint identification phase, performing, by a second fingerprint identification unit in the fingerprint identification unit group, a fingerprint identification according to light emitted by the sub-pixel at the second luminance and reflected by a touch subject;
wherein the second luminance is greater than the first luminance.

17. The driving method of claim 16, further comprising: after each negative frame display period, performing the first fingerprint identification phase and the second fingerprint identification phase sequentially.

18. The driving method of claim 16, wherein the first fingerprint identification unit comprises a first light sensing element and a gating transistor; the gating transistor is connected in series between a pixel circuit of the sub-pixel and the first light sensing element; and the second fingerprint identification unit comprises a second light sensing element, a first drive transistor, a selection output transistor, and a storage capacitor;

wherein the method comprises:
in the first fingerprint identification phase, controlling the gating transistor to be turned on, and the first light sensing element adjusting the sub-pixel, electrically connected to the first light sensing element, from the first luminance to the second luminance; and
in the second fingerprint identification phase, controlling the gating transistor to be turned off, sensing, by the second light sensing element, the light emitted by the sub-pixel at the second luminance and reflected by the touch subject to generate an electrical signal, generating, by the first drive transistor, a fingerprint identification signal according to the electrical signal generated by the second light sensing element, and turning on the selection output transistor and outputting the fingerprint identification signal.

19. The driving method of claim 18, wherein the second fingerprint identification unit further comprises a reset transistor connected in series between a power signal input line and a gate of the first drive transistor; and the second fingerprint identification phase comprises a reset sub-phase, a light receiving sub-phase and a data reading sub-phase;
wherein the method comprises:
in the reset sub-phase, turning off the gating transistor, turning on the reset transistor, and resetting, by the reset transistor, the gate of the first drive transistor;
in the light receiving sub-phase, turning off the gating transistor and the reset transistor, sensing, by the second light sensing element, the light emitted by the sub-pixel at the second luminance and reflected by the touch subject, and generating the electrical signal; and
in the data reading sub-phase, turning off the gating transistor and the reset transistor, turning on the selection output transistor, and outputting the fingerprint identification signal.

20. The driving method of claim 19, wherein a time period of an effective pulse inputted by a control end of the reset transistor is within a time period of an effective pulse inputted by a control end of the selection output transistor;

wherein the method comprises:
in the reset sub-phase, turning on the selection output transistor and outputting the fingerprint identification signal.

21. The driving method of claim 18, wherein the first light sensing element is multiplexed as the second light sensing element.

22. The driving method of claim 16, wherein a first electrode of the first light sensing element is electrically connected to a third bias signal end; a second electrode of the first light sensing element is electrically connected to a second electrode of the gating transistor; a first electrode of the gating transistor is electrically connected to the pixel circuit of the sub-pixel; and a third bias signal provided by the third bias signal end is less than a minimum value of a data signal.

* * * * *